(12) United States Patent
Wang et al.

(10) Patent No.: US 6,552,574 B1
(45) Date of Patent: Apr. 22, 2003

(54) LOW POWER DYNAMIC LOGIC GATE WITH FULL VOLTAGE SWING OPERATION

(75) Inventors: Lei Wang, Sunnyvale, CA (US); Qiang Li, Fremont, CA (US); Jianbin Wu, Fremont, CA (US)

(73) Assignee: PicoNetics, Inc., Fremont, CA (US)

( * ) Notice: Subject to any disclaimer, the term of this patent is extended or adjusted under 35 U.S.C. 154(b) by 0 days.

(21) Appl. No.: 10/087,604

(22) Filed: Mar. 1, 2002

(51) Int. Cl.$^7$ .................... H03K 19/096; H03K 19/20
(52) U.S. Cl. ........................... 326/98; 326/119
(58) Field of Search .................. 326/119, 112, 326/114, 93, 95, 98

(56) References Cited

U.S. PATENT DOCUMENTS

| | | | | |
|---|---|---|---|---|
| 4,017,741 A | * | 4/1977 | Briggs .................. | 377/79 |
| 5,473,270 A | * | 12/1995 | Denker ................. | 326/95 |
| 6,150,848 A | * | 11/2000 | Fouts et al. ............ | 326/96 |

FOREIGN PATENT DOCUMENTS

JP         07249982 A    *  9/1995

* cited by examiner

Primary Examiner—Michael Tokar
Assistant Examiner—James H. Cho
(74) Attorney, Agent, or Firm—Anthony B. Diebenbrock III; Oppenheimer Wolff & Donnelly, LLP (57) ABSTRACT

Dynamic low-power logic using recycled energy is disclosed. Logic circuits have a discharge path, a precharge path and a control circuit. The precharge path is a PMOS transistor coupled between the clock line and the output node of the circuit and configured to charge the output node to the logic high voltage of the clock line during a precharge phase. During an evaluation phase, the discharge path computes the desired logic function at the output node. A control circuit is connected between the output node and the clock line and to the gate of the precharge path transistor. The control circuit provides the proper gate drive, regardless of the voltage on the output node or the inputs to the discharge path, to guarantee that the precharge transistor fully charges the output node to the logic high voltage of the clock line, which provides recycled energy for operating the circuit.

10 Claims, 7 Drawing Sheets

FIG. 13

LOW POWER DYNAMIC LOGIC GATE WITH FULL VOLTAGE SWING OPERATION

CROSS-REFERENCE TO RELATED APPLICATIONS

This application is related to U.S. patent application Ser. No. 09/967,189, entitled, RESONANT LOGIC AND THE IMPLEMENTATION OF LOW POWER DIGITAL INTEGRATED CIRCUITS, filed Sep. 27, 2001, incorporated by reference, and U.S. patent application Ser. No. 09/614,494, entitled, RESONANT LOGIC AND THE IMPLEMENTATION OF LOW POWER DIGITAL INTEGRATED CIRCUITS, filed Jul. 11, 2000 now U.S. Pat. No. 6,448,816.

FIELD OF THE INVENTION

This invention is related generally to reduced power logic and more specifically to reduced power logic having full voltage output swing and operating with recycled energy.

DESCRIPTION OF THE RELATED ART

Figure 1:
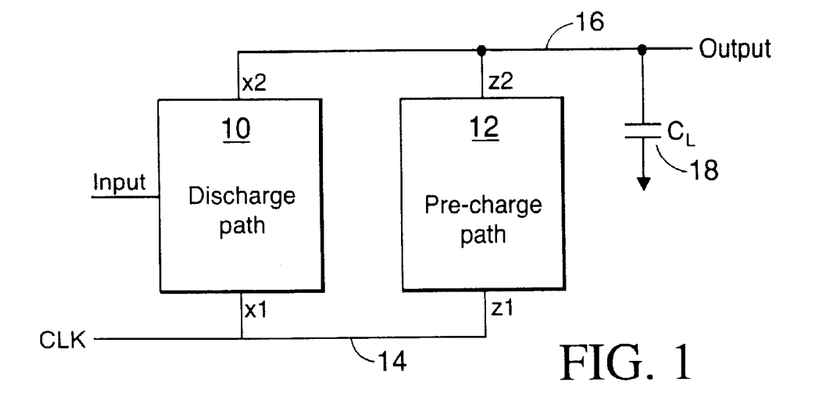
FIG. 1 shows the precharge and discharge paths disclosed in a previous application.
Figure 2A:
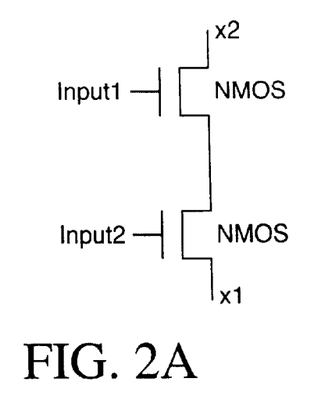
FIG. 2A shows a logic circuit stage for a NAND gate.

A previous application, U.S. patent application Ser. No. 09/967,189, entitled RESONANT LOGIC AND THE IMPLEMENTATION OF LOW POWER DIGITAL INTEGRATED CIRCUITS, disclosed a logic system operating with recycled energy. The logic disclosed therein included several logic gates each having a discharge path 10 and a precharge path 12 as shown in FIG. 1. The discharge path 10 and precharge path 12 are connected in parallel between a clock line 14 and an output node 16, having load capacitance, $C_L$ 18. The discharge path 10 is generally a logic circuit stage that implements a logic function, such as an inverter gate, NAND gate, as shown in FIG. 2A, or NOR gate (not shown), or part of a more complex logic function. A conductive path is developed between the output node and the clock line depending on the state of one or more inputs to the logic circuit stage during an evaluation period or phase. Thus, the discharge path 10 is conditionally conductive.

The precharge path 12, also connected between the output node 16 and the clock line 14, develops a conductive path, unconditionally, during a precharge phase or period. During this phase, the output node 16 is precharged to a voltage level related to the voltage level achieved by the clock line, which is a logic high during the precharge phase.

During the evaluation phase, the precharge path 12 is not conductive and during the precharge phase, the discharge path 10 is not conductive. Thus, in operation after the output node 16 is charged during the precharge phase, the logic function is evaluated during the evaluation phase, using the charge on the output node 16. If the inputs are such that the logic circuit stage is not conductive, then the output node 16 stays charged at the voltage level to which it was precharged. If the inputs are such that the logic circuit stage is conductive, then the output node 16 is discharged to approximately the low potential of the clock signal 14.

Figure 2B:
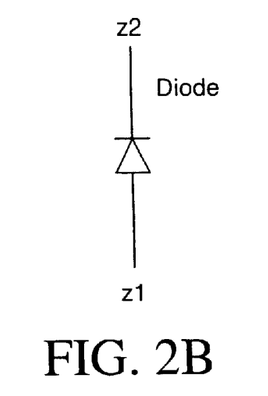
FIG. 2B shows a diode implementation of the precharge path.

In the previous application, the precharge path 12 is implemented as a diode, as shown in FIG. 2B. The diode implementation however creates a problem, in that the output node 16 cannot be precharged to a voltage substantially equal to the high voltage of the clock signal 14. This limits the voltage output of the output node 16 and has effects on circuitry that receives the less-than-full swing output from the logic circuit stage. One such effect is reduced drive to subsequent logic inputs if the circuit is operated at high clock rates, thereby reducing the maximum clock rate of such circuitry.

Therefore, there is a need the output of the logic circuit stage to achieve voltage levels substantially equal to the voltage levels of the clock signal carried on the clock line to which the logic circuit stage is connected.

BRIEF SUMMARY OF THE INVENTION

The present invention is directed towards the above need. The present invention, in accordance with one embodiment of the present invention, includes a discharge path, a precharge path and a control circuit. The discharge path is connected between a clock line and an output node and includes one or more transistors configured to evaluate a logic function of at least one input during an evaluation phase. The precharge path is connected between the clock line and the output node, and includes a PMOS transistor having a gate and a channel between a source and drain region of the transistor, the drain being connected to the output node and the source being connected to the clock line. The control circuit has an output connected to the gate of the precharge path transistor and is configured to maintain a source-to-gate voltage on the precharge path transistor such that, independent of the states of the inputs and the output node, the channel of the precharge transistor provides a conductive path between the clock line during a precharge phase.

The clock line of the present invention is connected to a clock circuit that captures, on the clock line, energy from the output node via the discharge path and provides a portion of the captured energy back to the output node via the precharge path.

A method in accordance with one embodiment of the present invention includes the steps of disabling the precharge path during a first voltage of the clock signal by providing the first voltage to the source of the PMOS transistor and enabling the precharge path during a second voltage of the clock signal by providing the second voltage to the source of the PMOS transistor and providing to a gate of the PMOS transistor a voltage having a range of approximately a NMOS transistor threshold voltage above the first voltage of the clock line to one PMOS transistor threshold voltage below the second voltage of the clock line.

An advantage of the present invention is that the voltage range of the output node is approximately equal to the voltage range of the clock line, which is approximately a range from zero volts to the positive supply voltage.

Another advantage is that the output node can drive more logic inputs at a given clock cycle rate.

Yet another advantage is that the logic circuitry can operate at a higher clock cycle rate.

Yet another advantage is that lower power operation is achieved by removing a direct path between the output node and the clock line that consumes power during switching.

Yet another advantage is that low power operation is achieved because a portion of the energy used to precharge the output node and operate the discharge path is returned to the output node by the clock circuit.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE INVENTION

Figure 3:
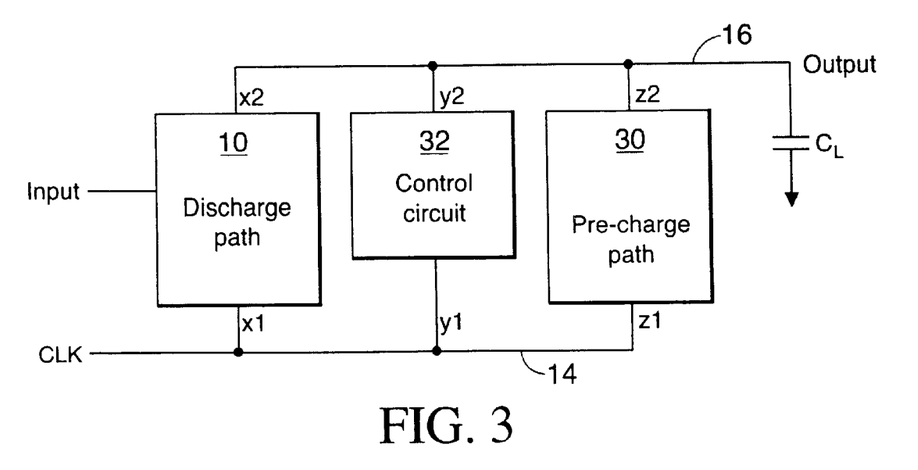
FIG. 3 shows a block diagram the discharge, precharge path and control circuit of the present invention.

FIG. 3 shows a block diagram of the discharge path 10, precharge path 30 and control circuit 32 of the present invention. The precharge path 30 of the present invention is connected between the output node 16 and the clock line 14 and to a control circuit 32 via path y3. The control circuit 32 is configured to substantially reduce the voltage drop across the precharge path 30 during precharging.

Figure 4A:
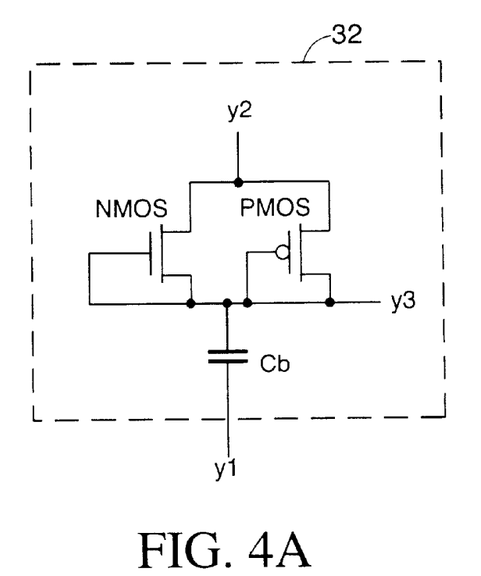
FIG. 4A shows an embodiment of the control circuit of the present invention.
Figure 4B:
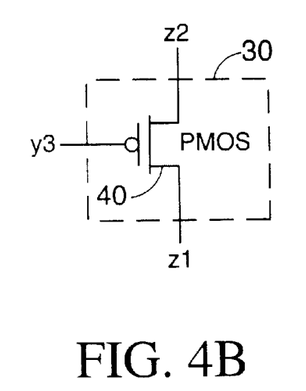
FIG. 4B show an embodiment of the precharge path of the present invention.

FIG. 4A shows an embodiment of the control circuit 32 of the present invention and FIG. 4B shows an embodiment of the precharge path 30 of the present invention. The diode of the previous precharge path is replaced with a transistor 40, whose channel is connected between the output node 16 and the clock line 14. The gate node y3 of the precharge transistor 40 is connected to the control circuit 32 node y3 which provides the proper source-to-gate voltage to turn on the transistor 40 regardless of whether the output node 16 is charged to a logic high or a logic low. Capacitance Cb is an intrinsic capacitance between the y1 and y3 nodes.

Figure 5:
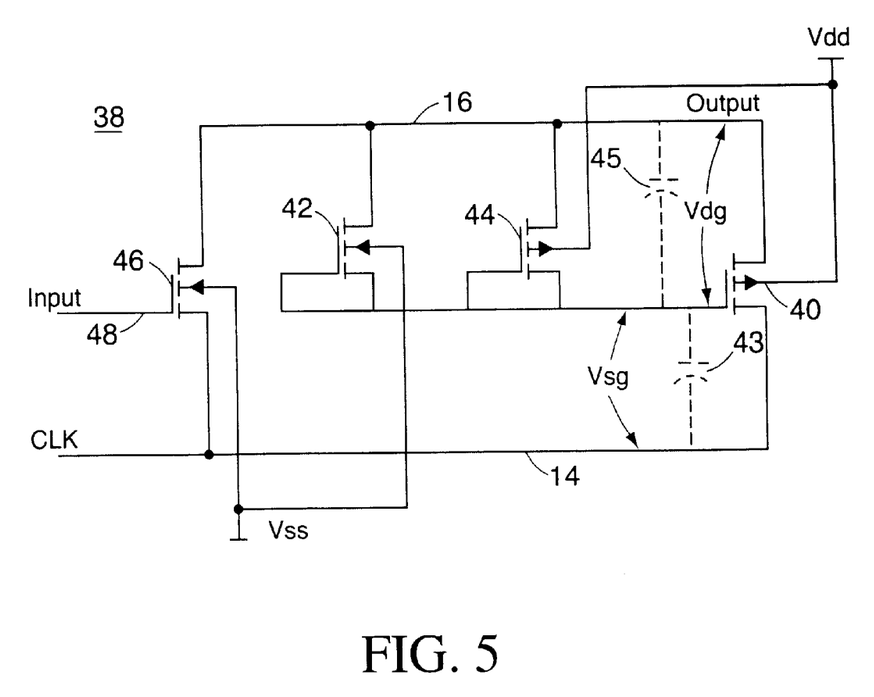
FIG. 5 shows an INVERTER gate, in accordance with the present invention.

FIG. 5 shows an INVERTER gate, in accordance with one embodiment of the present invention. Transistor 46 provides the discharge path and implements an inverter logic function. Transistor 46 has its channel connected between the output node 16 and the clock line 14. The gate of transistor 46 is connected to an input 48 on which the transistor 46 operates to produce an inverted version of the input 48 at the output node 16. The substrate of transistor 46 is tied to the lowest voltage in the circuit, Vss. The control circuit 32 includes transistor 42, an NMOS transistor, and transistor 44 a PMOS transistor, each connected in a diode configuration. The channels of transistor 42 and transistor 44 are each connected between the gate of transistor 40 and the output node 16 and the sources of both transistors 42, 44 connect to the output node 16. The substrate of the NMOS transistor 42 is connected to Vss and the substrate of PMOS transistor is connected to Vdd. Transistor 40, the precharge PMOS transistor, has its channel connected between the clock line 14 and the output node 16, the source of transistor 40 being connected to the clock line 14 and the drain of transistor 40 being connected to the output node 16. The substrate of transistor 40 is connected to Vdd.

The clock line 14 carries a clock signal that has a first voltage and a second voltage. If the clock signal is a digital signal, the first voltage is a logic high and the second voltage is a logic low. During a precharge phase, while the clock signal is at a logic high, the output node 16 is precharged through transistor 40, whose channel is made conductive by either transistor 44 or transistor 42. During an evaluation phase, while the clock signal is at a logic low, transistor 40 is rendered non-conductive and transistor 46 is conditionally conductive depending on whether the input 48 is high or low. If the input 48 is high, then transistor 46 is conductive, thereby discharging the output node 16 to the clock line 14. If the input 48 is low, then transistor 46 is not conductive and the output node 16 is maintained at or near the voltage to which it was previously precharged.

As is apparent from the above description, output node 16 of the INVERTER circuit 38 has a voltage that is either close to the lower voltage on the clock line or close to the higher voltage on the clock line. Transistor 42 handles the case in which the voltage on the output node 16 is close to the lower voltage on the clock line 14, at the start of the precharge phase. Transistor 44 handles the case in which the voltage on the output node 16 is close to the higher voltage one clock line 14, at the start of the precharge phase.

If the voltage on the output node 16 is close to the lower voltage on the clock line, i.e., close to zero volts, at the start of the precharge phase, and the voltage on the clock line 14 during the precharge phase is a logic high, approximately equal to the positive supply voltage, then the channel of transistor 40 becomes conductive, because there is sufficient source-to-gate voltage Vsg, which is taken as positive in the direction of source to gate. The source node of transistor 40 is at a logic high, and the gate is approximately one threshold voltage, Vtn, above the voltage at the output node, i.e., Vout+Vtn, where Vtn is the threshold voltage for an NMOS transistor. For example, if the output node 16 is zero volts, then the voltage on the gate of 40 is approximately a threshold voltage Vtn for an n-channel device, because 44 is a diode-connected transistor. If, in one embodiment, Vtn for an NMOS transistor and Vtp are each about one volt, then the gate of 40 is approximately 1 volt. If, in this embodiment, the positive supply voltage is 5 volts, then the source-to-gate voltage for the PMOS transistor 40 is about +4 volts, which is greater than the threshold voltage Vtp. Thus, under the above conditions, transistor 40 has a conducting channel between the clock line 14 and the output node 16. This conducting channel allows the output node 16 to charge from clock line 14. As the output node rises towards the logic high voltage of the clock line 14, the channel of transistor 42 becomes less conductive and cuts off at the point when the output voltage is approximately an n-channel threshold voltage Vtn higher than the gate of 40. At this voltage, transistor 44 begins to help maintain the source-to-gate Vsg drive of transistor 40, by holding the gate voltage of transistor 40 at approximately Vtp below the output voltage Vout, i.e., at Vout−Vtp. Thus, transistor 44 helps to assure that the gate of transistor 40 cannot rise so far as to diminish the transistor 40's source-to-gate voltage, approximately Vout−Vtp, that is necessary for maintaining conduction of transistor 40.

It should be noted that if the output node 16 is charged to the logic high voltage of the clock line 14, then channel of transistor 46 cannot conduct during the precharge phase because there is insufficient gate-to-source voltage, no matter which terminal of transistor 46 is considered the source node and regardless of the state of the input 48 to transistor 46.

During the evaluation phase, transistor 40 is non-conducting regardless of the state of the output node 16. If the state of the output node stays charged during the evaluation phase, because the logic path is non-conducting, the drain-to-gate voltage Vdg of transistor 40 is V'out−Vg, where V'out is close to, but slightly less than, the logic high voltage of the clock line, and Vg is the gate voltage from the previous precharge cycle. Though the source terminal of transistor 40 has a voltage of approximately zero volts, the voltage Vdg=V'out−Vg between the drain and gate of transistor 40 is not sufficient to cause transistor 40 to conduct from output 16 to clock line 14, because it is less than the threshold voltage Vtp of transistor 40, i.e., Vdg=Vtp−(Vout−V'out), and V'out is slightly less than Vout.

If the output node was previously discharged, then the gate of transistor 40 is at approximately Vout+Vtn, where Vout is close to the logic low voltage of the clock line 14, and both the source-to-gate voltage and drain-to-gate voltage for transistor 40 have the incorrect polarity for conduction between the clock line 14 and the output node 16.

Thus, the device of FIG. 5 has an output voltage on the output node 16 that is either substantially close to the logic high voltage or a logic low voltage of the clock line 14. If the clock line 14 has a low voltage of zero volts and a high voltage equal to the positive supply voltage, then the output voltage of the circuit of FIG. 5 has a full logic swing.

Compared to a traditional logic inverter, the circuit 38 of FIG. 5 has the advantages of low power and high drive capability. The low power characteristic derives from not using a PMOS and an NMOS transistor in series between the positive supply voltage and ground. In the latter arrangement, a high current flows during switching because there is a short time interval in which both the PMOS and NMOS transistors are on. Not only does this causes a high current to flow from the positive voltage supply to ground, but it also causes a the PMOS and NMOS transistors to contend with each other during the charging or discharging of the load capacitance at the output of the traditional inverter. In contrast, the inverter of the present invention, has separate control signals for NMOS and PMOS transistors. High switching currents are avoided and there is no contention at the output. Controlling the gate voltage and size of transistor 40 allows the output to drive large capacitive loads. The total area of the circuit of FIG. 5 can be made to be smaller than a traditional device having the same drive characteristics.

Figure 6:
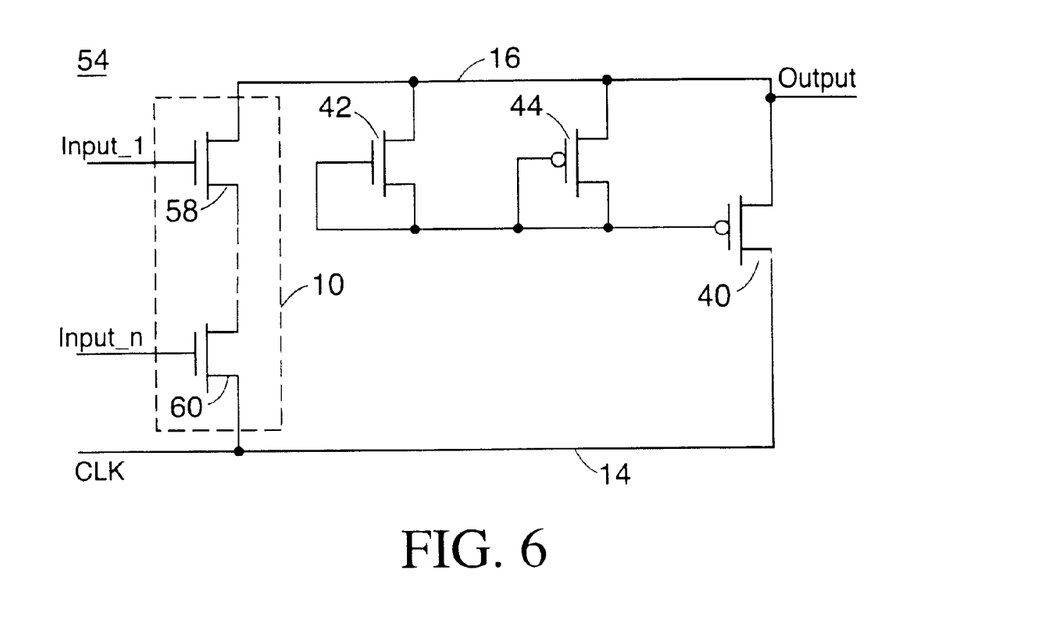
FIG. 6 shows a NAND gate, in accordance with the present invention.
Figure 7:
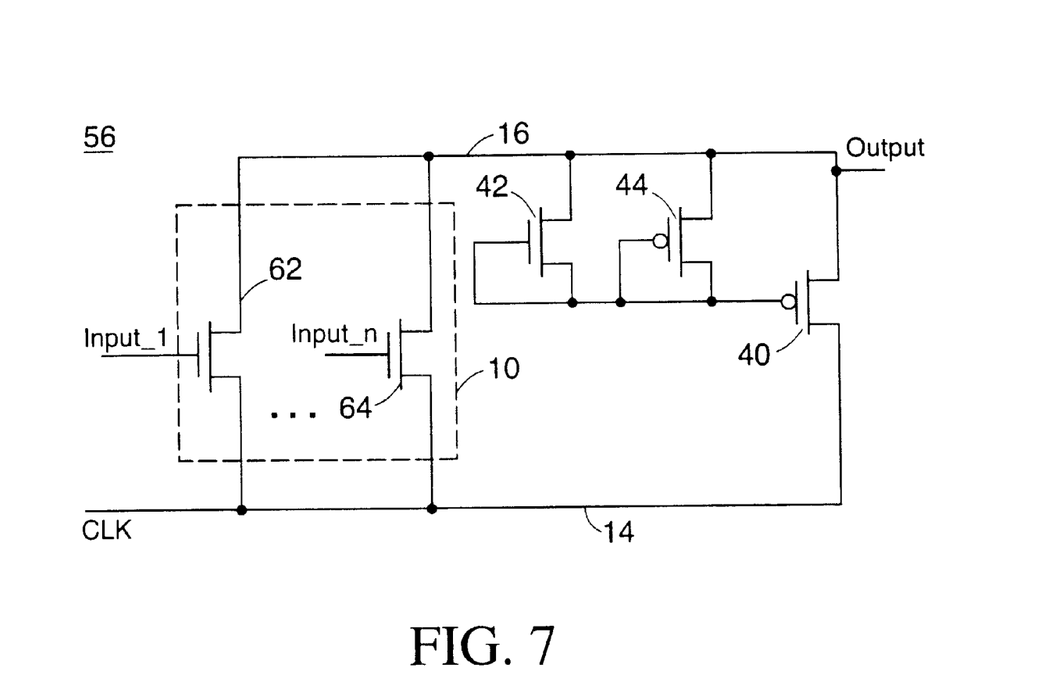
FIG. 7 shows a NOR gate, in accordance with the present invention.

FIG. 6 shows a NAND gate 54, in accordance with the present invention, and FIG. 7 shows a NOR gate 56, in accordance with the present invention. The discharge path 10 of FIG. 6 includes two or more NMOS transistors 58–60, connected in series to implement a multi-input NAND function during the evaluation phase. The discharge path 10 of FIG. 7 includes two or more NMOS 62–64 transistors connected in parallel to implement a multi-input NOR function during the evaluation phase.

Figure 8:
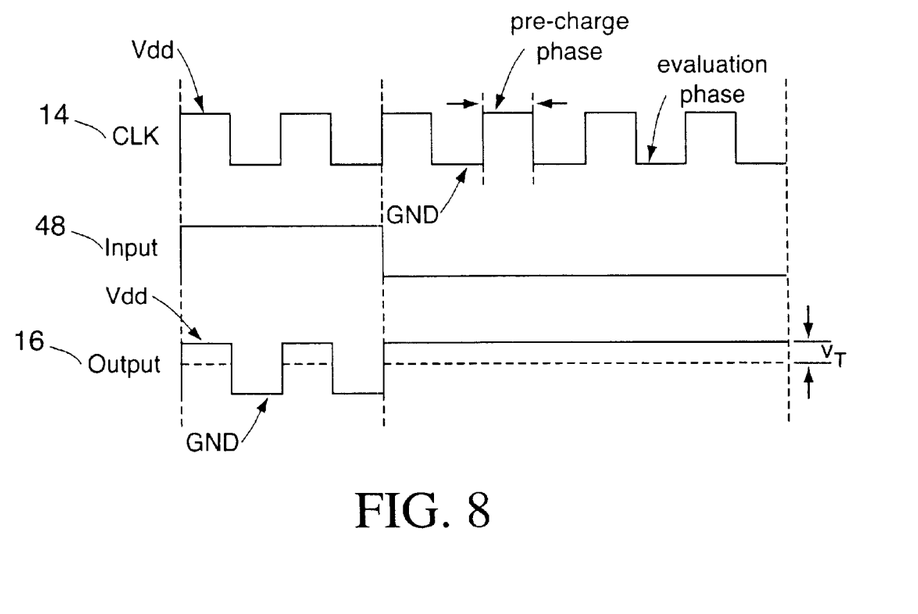
FIG. 8 shows waveforms depicting the operation of an inverter, in accordance with the present invention.

FIG. 8 shows waveforms depicting the operation of an inverter 38 of FIG. 5, in accordance with the present invention. The low phase of the clock 14 is the evaluation phase and the high phase of the clock is the precharge phase.

The output 16 follows the waveform on the clock line 14 when the input to the inverter is high, causing the output 16 to be low during the evaluation phase. The output voltage is maintained at the positive supply voltage, Vdd, when the input is low. The clock waveform on clock line 14 is not limited to a square wave. Sinusoidal waveforms can also be used for the clock signal. The precharge and evaluation times for a sinusoidal waveform are determined by the thresholds of the transistors comprising the inverter 38. FIG. 8 shows the output in accordance with the present invention, i.e., without the Vt drop that would have been present otherwise.

Figure 9:
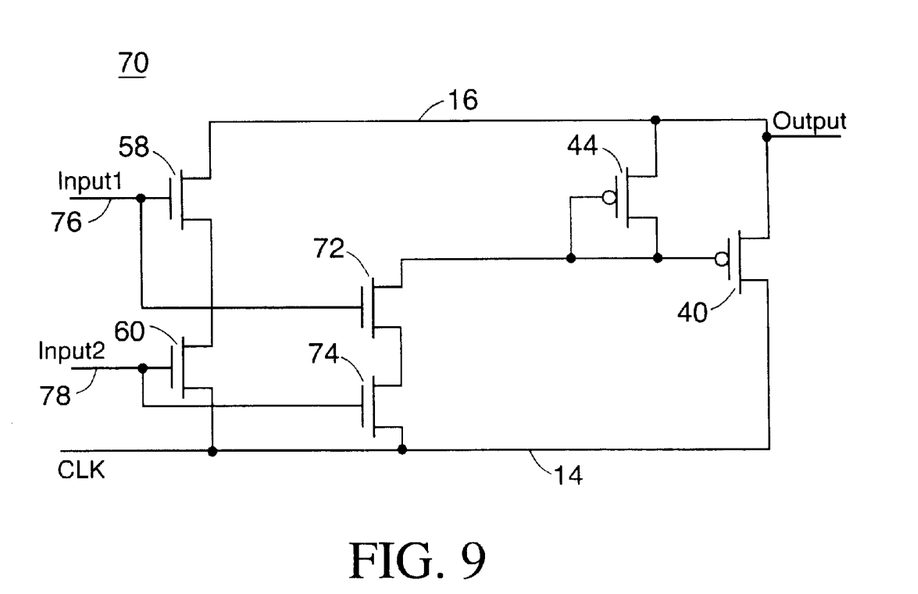
FIG. 9 shows a NAND gate with adjustable drive capability, in accordance with the present invention.

FIG. 9 shows a NAND gate 70 with adjustable drive capability, in accordance with the present invention. The control circuit of FIG. 5 is modified, removing the NMOS diode-connected transistor 42 and adding an auxiliary NAND function between the gate of transistor 40 and the clock line 14. The auxiliary NAND function includes two NMOS transistors 72, 74 whose channels are connected in series and whose gates are each connected to one of the inputs 76, 78 of the discharge path logic function. If and when the output node 16 of the circuit is discharged by the discharge path during the evaluation phase, the gate of transistor 40 is also discharged to the logic low voltage of the clock line 14, because transistor 72 and transistor 74 are conductive. This increases the gate drive of transistor 40 when the clock line 14 changes to a logic high voltage. Whereas, in the circuit of FIG. 5, the gate drive of transistor 40 was approximately Vdd−Vtn, the gate drive of transistor 40 in the circuit of FIG. 9 is approximately Vdd. This change improves precharge efficiency and the strengthens the drive characteristics of the circuit.

Figure 10:
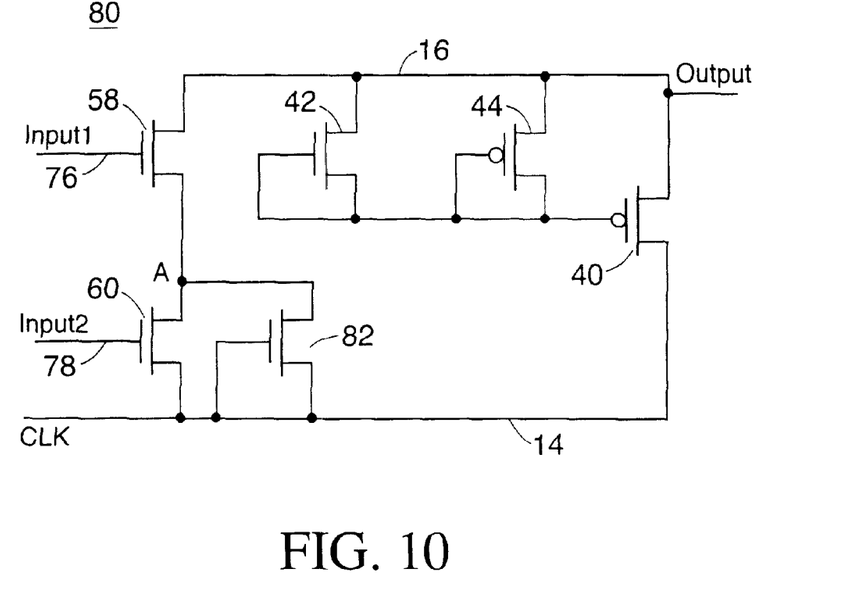
FIG. 10 shows a NAND gate with reduced charge sharing effect.

FIG. 10 shows a NAND gate 80 with reduced charge-sharing effect. In this circuit 80, a diode-connected NMOS transistor 82 is added across the input transistor 60 and the control circuit in FIG. 5 is used. When the clock line 14 is high, node A, between the two input transistors 58, 60, is charged to Vdd−Vtn. This prevents the other input transistor 58 from sharing charge with the output node 16, thereby preventing a small voltage loss on the output node 16. Without transistor 82, when input 76 is high and input 78 is low, transistor 58 is on and transistor 60 is off. If node A is initially at approximately zero volts, output charge is shared with the parasitic capacitance of transistor 58. With transistor 82, node is forced to Vdd−Vtn, reducing the amount of charge transfer from the output node 16 to the parasitic capacitance at node A.

Figure 11:
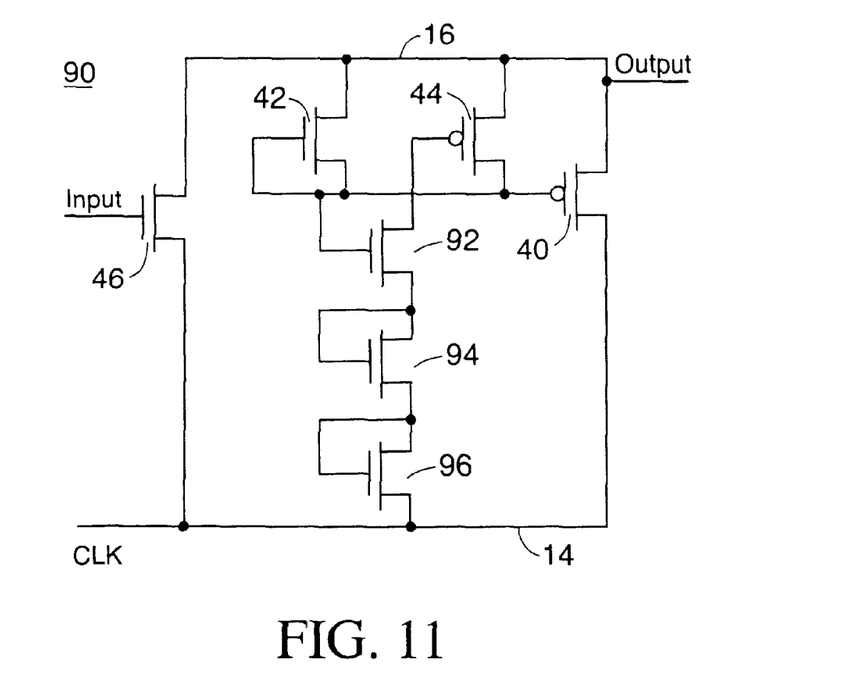
FIG. 11 shows an INVERTER with reduced charge-pump effect.

FIG. 11 shows an INVERTER with reduced charge-pump effect. The charge-pump effect occurs because of the parasitic capacitances 43, 45 shown in FIG. 5. Parasitic capacitance 43 tends to cause the gate of transistor 40, after a large number of evaluation phases in which the output node was not discharged, to rise toward the high voltage of the clock line 14, in FIG. 5. Also, the charging of the output node during the precharge phase, tends to cause the gate of transistor 40 to rise. To counteract the effects of these parasitic capacitances, a stack of n-channel diode-connected transistors 92, 94, 96 is connected between the gate of transistor 40 and the clock line 14. The number n of n-channel diode-connected transistors 92, 94, 96 in the stack varies, depending on the magnitude of the positive supply voltage and the threshold value of the transistors. A stack of n transistors gives a voltage between the clock line and the gate of transistor 40 of about n×Vtn, neglecting the body effect for these devices. The drain of the n-channel transistor 92 at the top of the stack is connected to the gate of transistor 40 and the source of n-channel transistor 96 at the bottom of the stack is connected to the clock line 14. This transistor stack controls the voltage at the gate of transistor 40 at a level that assures that transistor 40 turns on when the clock line is a logic high.

Figure 12:
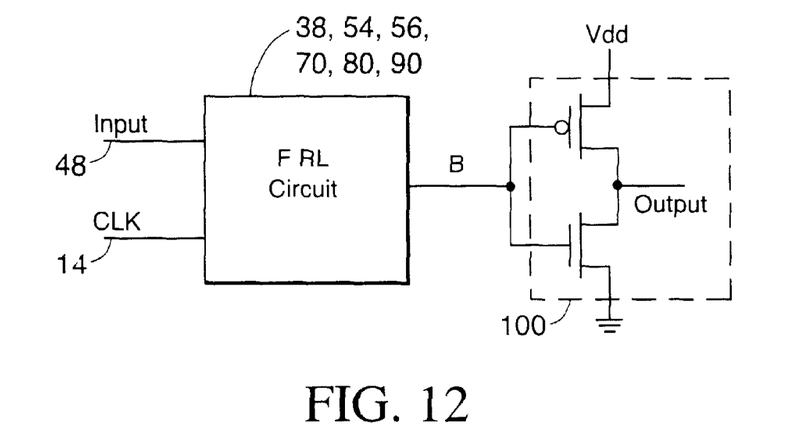
FIG. 12 shows how a circuit of the present invention interfaces with conventional logic gates.

FIG. 12 shows how an embodiment 38, 54, 56, 70, 80, 90 of the present invention interfaces with conventional logic gates. The output node of the logic circuit 38, 54, 56, 70, 80, 90 of the present invention is connected to the input of a traditional inverter circuit 100. With the full voltage swing operation of the logic circuit of the present invention, interfacing with a traditional inverter is improved, because time during which the NMOS and PMOS transistors are both on is very reduced.

Figure 13:
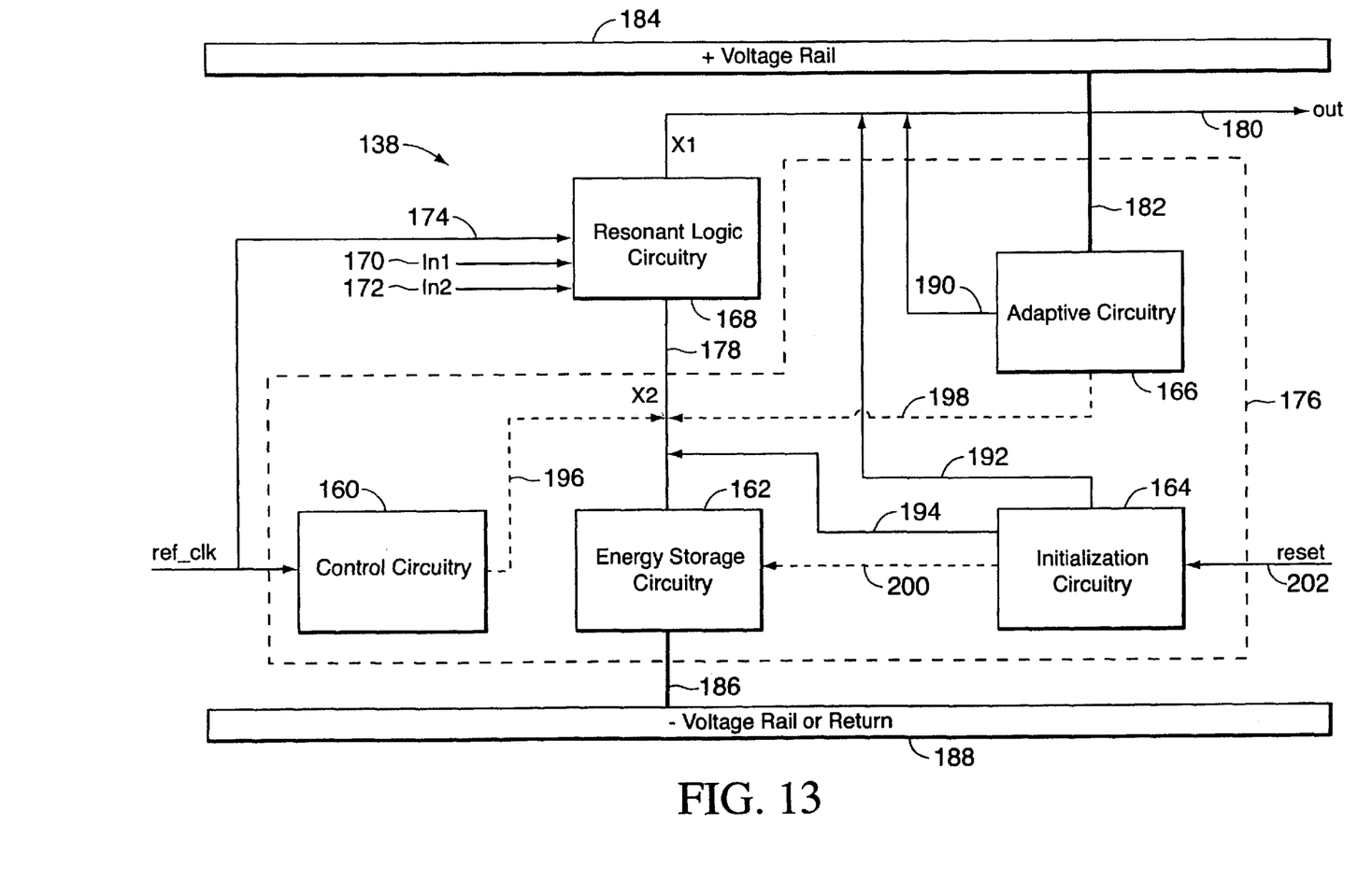
FIG. 13 shows a clock circuit block diagram that provides a clock signal to the logic circuitry of the present invention.

FIG. 13 shows a clock circuit block diagram 176 that provides a clock signal on node X2 to the logic circuitry of the present invention. The output node of the logic circuitry is X1 180. The clock circuit 176 includes energy storage circuitry 162 that oscillates at a frequency governed by a reference clock ref_clk 174, initialization circuitry 164 that starts the oscillations of the energy storage circuit 162, control circuitry 160 that maintains the frequency of the oscillations of the energy storage circuit and an adapter circuitry 166 that periodically provides energy to the energy storage circuit 162 to make up for dissipative losses in the circuitry. Energy storage circuitry 162 connects to the voltage return rail 188 via connection 186 and adaptive circuitry 166 connects to the positive voltage rail 184 via connection 182.

Figure 14:
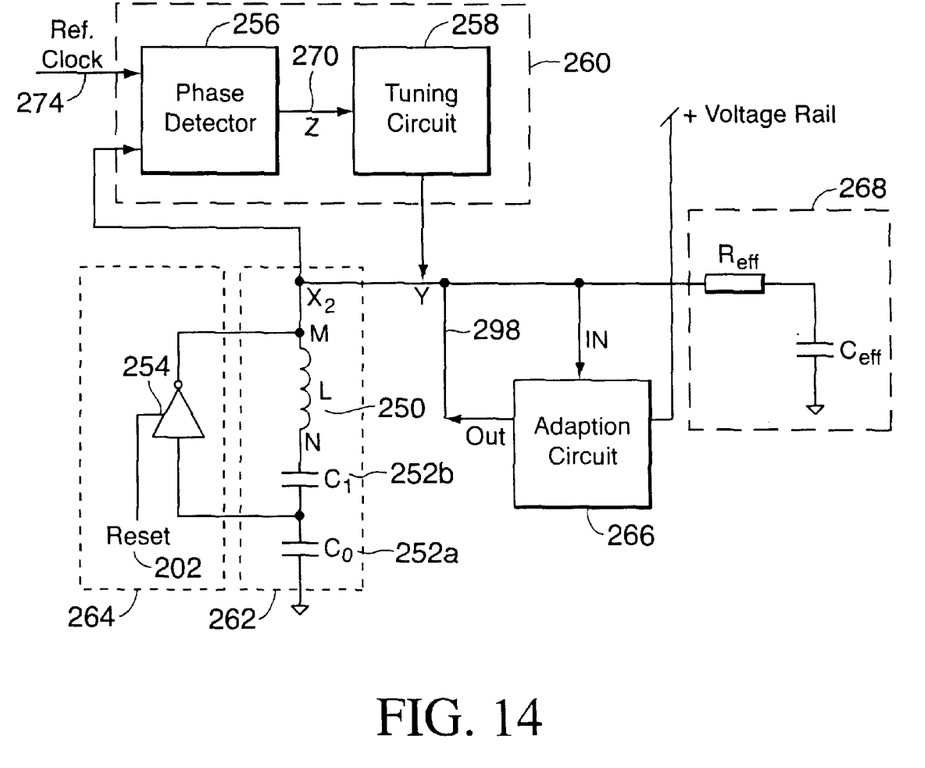
FIG. 14 shows an embodiment of the clock circuit block diagram.

FIG. 14 shows an embodiment of the clock circuit block diagram. The initialization circuitry 264 connects to the energy storage circuitry 262 to initialize oscillations in the energy storage circuitry 262. The control circuitry 260, which includes a phase detector 256 and a tuning circuit 258, connects to the output node X2 of the energy storage circuitry 262 and to a reference clock 274 to control the frequency of the oscillations in the energy storage circuitry 262. The adaptive circuitry 266 also connects to the output X2 of the energy storage circuitry 262 along with the effective circuit model of the logic circuitry 268. The effective circuit model includes the discharge path, the precharge path and the control circuitry and any enhancements thereto such as transistors 72, 74 of FIG. 9, transistor 82 of FIG. 10, or transistors 92, 94 and 96.

In the energy storage circuitry 262, there are two capacitors Co' 252a and C1 252b, where C1 is much smaller than Co'. The junction between the two provides a point of control for the initialization circuitry 264.

The initialization circuitry 264 includes an inverter circuit 254 that is connected to the output of the energy storage circuitry 262 and the junction of the C1 252b and Co' 252a capacitances. A reset line 202 controls whether the inverter 254 has a high-impedance output or a low impedance output, which is the inversion of the input. When the reset line 202 is active, the inverter 254 is in the low impedance output state, which causes the energy storage circuit 262 to oscillate. When the reset line 202 is deactivated, the inverter 254 changes to a high-impedance output and the resonant circuit continues to oscillate on its own with a frequency that is controlled by C1, Co', Ceff and the output, Cx, of the tuning circuit.

As mentioned above, the control circuitry 260 includes a phase detector 256 and a tuning circuit 258 that together cause the frequency of the energy storage circuitry oscillations to be equal to the reference clock 274. Phase detector 256 receives the reference clock 274 and the output X2 of the energy storage circuitry 262, compares the two to control the tuning circuit 258 that modifies the frequency of the energy storage circuitry 262 to be the same as frequency of the reference clock 274.

Adaptive circuitry 266 is also connected to the output X2 of the energy storage circuitry 262 to replenish energy that is dissipated in the logic circuitry 268, modeled as an effective resistance Reff and effective capacitance Ceff.

In operation, the energy storage circuitry 262 begins oscillating at it natural resonant frequency after the deactivation of the reset line 202. The natural resonant frequency is related inversely to the square root of the product of L and the value of (Co||C1||Ceff), where 'x||y' is defined as the quantity xy/(x+y). If C1' is much smaller than the other capacitances, then it is the capacitance that influences the natural resonant frequency the most (because (Co||C1||Ceff) is approximately equal to C1'). Once started, the energy storage circuitry is then locked to the reference clock input by the phase detector 256 and tuning circuit 258. The phase detector 256 detects a phase difference between the energy storage circuitry frequency and the reference clock and converts this difference into a signal Z that controls the tuning circuit 258. The tuning circuit 258 then alters the oscillation frequency of the energy storage circuitry 262 by adding either inductance or capacitance into the energy storage circuitry 262 so as to drive the phase difference towards zero. If the amplitude of the oscillations of the energy storage circuit begin to diminish in amplitude, then adaptive circuitry 266 is activated to provide a synchronous energy boost to the oscillations, thereby restoring the amplitude.

Although the present invention has been described in considerable detail with reference to certain preferred versions thereof, other versions are possible. Therefore, the spirit and scope of the appended claims should not be limited to the description of the preferred versions contained herein.

What is claimed is:

1. A logic circuit comprising:
   a discharge path connected between a clock line and an output node, the discharge path including one or more transistors configured to evaluate a logic function of at least one input during an evaluation phase;
   a precharge path connected between the clock line and the output node, the precharge path including a PMOS transistor having a gate and a channel between a source and drain region of the PMOS transistor, the drain being connected to the output node and the source being connected to the clock line; and
   a control circuit having an output connected to the gate of the precharge path transistor, the control circuit configured to maintain a source-to-gate voltage on the precharge path transistor such that, independent of the states of the inputs and the output node, the channel of the precharge path transistor provides a conductive path between the clock line and the output node during a precharge phase.

2. A logic circuit as recited in claim 1,
   wherein the control circuit is connected between the gate of the precharge transistor and the output node; and
   wherein the control circuit includes a PMOS transistor and an NMOS transistor, each having a gate and a channel between a source and drain region of the transistor, the drain and gate of each transistor connected together to form a diode-connected transistor, the drain and gate of each transistor connected to the gate of the precharge transistor and the source of each transistor connected to the output node.

3. A logic circuit as recited in claim 2, wherein the control circuit further includes a plurality of diode-connected NMOS transistors that are connected in series, the plurality connected between the gate of the precharge transistor and the clock line.

4. A logic circuit as recited in claim 1, wherein the discharge path includes an NMOS transistor having a gate and a channel between a source and drain region of the transistor, the channel of the NMOS transistor connected between the output node and the clock line, the gate connected to the at least one input to implement an inverter function at the output node.

5. A logic circuit as recited in claim 1,
wherein there are two inputs; and
wherein the discharge path includes at least two NMOS transistors, each having a gate and a channel between a source and drain region of each transistor, the channels being connected in series to together form conductive path between the output node and the clock line, each gate being connected to one of said inputs to implement, at the output node, a 2-input NAND function of said inputs.

6. A logic circuit as recited in claim 5, wherein the control circuit includes a pair of NMOS transistors, each having a gate and a channel between a source and drain region of each transistor, the channels being connected in series to form a conductive path between the gate of the precharge transistor and the clock line, each gate of each one of the pair of NMOS transistors being connected to one of the inputs.

7. A logic circuit as recited in claim 5,
wherein the clock line cycles between a high voltage and a low voltage; and
further comprising a diode-connected NMOS transistor having a gate and a channel between a source and drain region of the transistor, the drain of the diode-connected NMOS transistor being connected to the clock line and the source of the diode-connected NMOS transistor being connected to a junction at which the channels of the pair of NMOS transistors connect, the diode-connected NMOS transistor charging, during the precharge phase, the junction between the series-connected transistors to a voltage approximately equal to the clock line voltage less a NMOS transistor threshold voltage.

8. A logic circuit as recited in claim 1,
wherein there are two inputs; and
wherein the discharge path includes at least two NMOS transistors, each having a gate and a channel between a source and drain region of each transistor, each channel forming a conductive path between the output node and the clock line, each gate being connected to one of the inputs to implement, at the output node, a 2-input NOR function of the inputs.

9. A logic circuit as recited in claim 1,
wherein the clock line connects to a clock circuit; and
wherein the clock line carries a signal provided by the clock circuit that captures energy from the output node via the discharge path during the evaluation phase and provides a portion of the captured energy via the precharge path to the output node during the precharge phase.

10. A method of controlling a precharge path in a logic circuit that includes a discharge path connected between an output node and a clock line and including one or more transistors for implementing a logic function of the logic circuit, the precharge path including a PMOS transistor having a source connected to the clock line and a drain connected to the output node, the clock line carrying a clock signal cycling between a first voltage and a second voltage, the method comprising:
disabling the precharge path during first voltage of the clock signal by providing the first voltage to the source of the PMOS transistor; and
enabling the precharge path during the second voltage of the clock signal by providing the second voltage to the source of the PMOS transistor and providing to a gate of the PMOS transistor a voltage having a range of approximately a NMOS transistor threshold voltage above the first voltage of the clock line to one PMOS transistor threshold voltage below the second voltage of the clock line.

* * * * *